United States Patent [19]
Brady et al.

[11] Patent Number: 5,151,387
[45] Date of Patent: Sep. 29, 1992

[54] POLYCRYSTALLINE SILICON CONTACT STRUCTURE

[75] Inventors: James Brady, Dallas; Tsiu C. Chan, Carrollton; David S. Culver, The Colony, all of Tex.

[73] Assignee: SGS-Thomson Microelectronics, Inc., Carrollton, Tex.

[21] Appl. No.: 516,272

[22] Filed: Apr. 30, 1990

[51] Int. Cl.$^5$ .................................... H01L 21/44
[52] U.S. Cl. ..................... 437/191; 437/200; 437/43; 437/192; 148/DIG. 19
[58] Field of Search ............... 437/49, 177, 178, 189, 437/191, 193, 195, 200, 43, 192; 148/DIG. 19, DIG. 20, DIG. 147

[56] References Cited

U.S. PATENT DOCUMENTS

| | | | |
|---|---|---|---|
| 4,398,335 | 8/1983 | Lehrer | 437/193 |
| 4,562,640 | 1/1986 | Widmann et al. | 437/193 |
| 4,581,623 | 4/1986 | Wang | 148/DIG. 19 |
| 4,617,071 | 10/1986 | Vora | 437/55 |
| 4,677,735 | 7/1987 | Malhi | 437/52 |
| 4,714,685 | 12/1987 | Schubert | 437/200 |
| 4,849,344 | 7/1989 | Desbiens et al. | 437/200 |
| 4,870,033 | 9/1989 | Hotta et al. | 437/200 |
| 4,874,719 | 10/1989 | Kurosawa | 437/195 |
| 4,948,747 | 8/1990 | Pfiester | 437/60 |

OTHER PUBLICATIONS

Wolf, Stanley, *Silicon Processing for the VLSI Era*, vol. 2, Lattice Press, Sunset Beach, Calif. (1990), Chapters 3 & 4.

*Primary Examiner*—Brian E. Hearn
*Assistant Examiner*—Kevin M. Picardat
*Attorney, Agent, or Firm*—Kenneth C. Hill; Lisa K. Jorgenson; Richard K. Robinson

[57] ABSTRACT

A contact structure provides electrical contact between two polycrystalline silicon interconnect layers. The lower layer has a silicide layer on its upper surface. The upper polycrystalline silicon layer can be doped with a different conductivity type, and makes an ohmic contact with the silicided region of the lower polycrystalline silicon layer.

7 Claims, 1 Drawing Sheet

POLYCRYSTALLINE SILICON CONTACT STRUCTURE

BACKGROUND OF THE INVENTION

1. Field of the Invention

The present invention is related generally to integrated circuits, and more specifically to a contact between different layers of polycrystalline silicon interconnect.

2. Description of the Prior Art

In semiconductor circuits, it is known that ohmic contacts are desirable between interconnect layers. An ohmic contact is one in which no P-N junction is formed.

When polycrystalline silicon interconnect lines having different conductivity types make contact, a P-N junction is formed. A similar junction can be formed when polycrystalline silicon having the same conductivity type, but very different doping levels (such as $N^{--}$ to $N^+$) make contact. For various reasons, it is often desirable to have interconnect having different conductivity types make contact, and it would be desirable to provide an ohmic contact for such structures.

SUMMARY OF THE INVENTION

It is therefore an object of the present invention to provide an ohmic contact between polycrystalline silicon interconnect layers having different conductivity types.

It is another object of the present invention to provide such a contact which is easily formed with a process compatible with existing process technologies.

It is a further object of the present invention to provide such a contact which is suitable for use in an SRAM structure to provide a load.

Therefore, according to the present invention, a contact structure provides electrical contact between two polycrystalline silicon interconnect layers. The lower layer has a silicide layer on its upper surface. The upper polycrystalline silicon layer can be doped with a different conductivity type, and makes an ohmic contact with the silicided region of the lower polycrystalline silicon layer.

BRIEF DESCRIPTION OF THE DRAWINGS

The novel features believed characteristic of the invention are set forth in the appended claims. The invention itself however, as well as a preferred mode of use, and further objects and advantages thereof, will best be understood by reference to the following detailed description of an illustrative embodiment when read in conjunction with the accompanying drawings, wherein:

DESCRIPTION OF THE PREFERRED EMBODIMENT

The process steps and structures described below do not form a complete process flow for manufacturing integrated circuits. The present invention can be practiced in conjunction with integrated circuit fabrication techniques currently used in the art, and only so much of the commonly practiced process steps are included as are necessary for an understanding of the present invention. The figures representing cross-sections of portions of an integrated circuit during fabrication are not drawn to scale, but instead are drawn so as to illustrate the important features of the invention.

Figure 1:
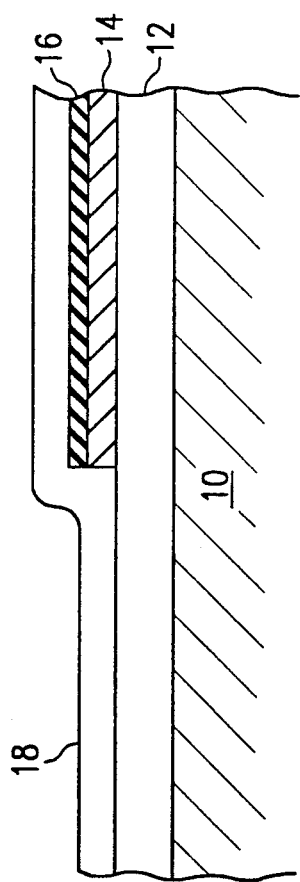
FIGS. 1-3 illustrate a preferred method for forming a contact according to the present invention.

Referring to FIG. 1, a semiconductor substrate 10 is partially covered with an oxide layer 12. The oxide layer 12 is not complete over the entire surface of the substrate 10, but that portion of interest to the present description has no openings to the substrate 10.

A polycrystalline silicon layer 14 lies on the oxide layer 12. In the illustrative embodiment, layer 14 is doped N-type. The polycrystalline silicon layer 14 has been silicided to form a silicide layer 16 thereon. The polycrystalline silicon 14 and silicide layer 16 have been patterned in a previous processing step as known in the art to form a signal line. The polycrystalline silicon layer 14 may be a first polycrystalline silicon layer, such as commonly used to form gate electrodes of field effect devices. Alternatively, polycrystalline silicon layer 14 may be a second or later level used for interconnect between different portions of an integrated circuit device. At the processing stage shown in FIG. 1, the transistors of the device have already been formed.

Once the polycrystalline silicon and silicide layers 14, 16 have been formed and patterned, an oxide layer 18 is formed over the surface of the device. Oxide layer 18 is typically a thin oxide layer, having a thickness of between 500 and 1000 angstroms. The thickness of oxide layer 18 may be any thickness which is compatible with the fabrication process with which the invention described herein is being used.

Figure 2:
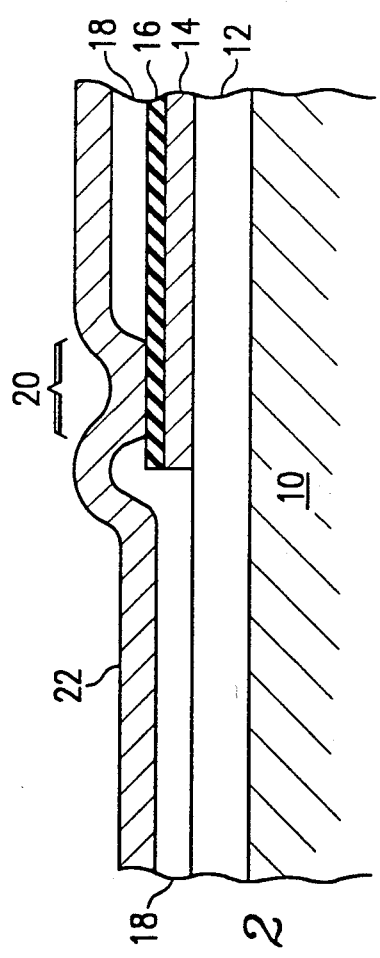

Referring to FIG. 2, oxide layer 18 is patterned and etched to define a contact opening 20 to the upper surface of the silicide layer 16. A layer of polycrystalline silicon 22 is then deposited over the surface of the device.

A light dosage of boron is implanted into the polycrystalline silicon layer 22 in order to convert it to a P-type conductor. A typical dosage would be approximately $10^{13}$ atoms/cm$^2$.

Figure 3:
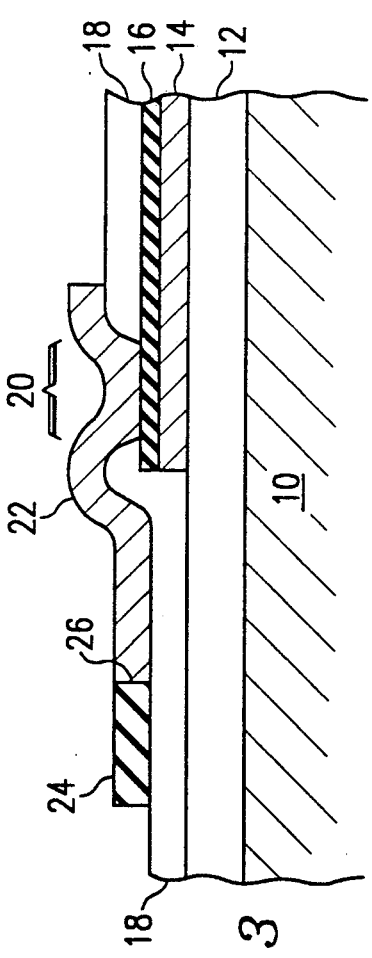

Referring to FIG. 3, the polycrystalline silicon layer 22 is then masked, and a heavy arsenic implant made to define an $N^+$ region 24. A typical dosage for such implant is $5 \times 10^{15}$ atoms/cm$^2$. Such doping level is used to allow the $N^+$ region 24 to be used as a power supply line.

A P-N junction 26 is formed at the interface between the $N^+$ region 24 and the lightly P-doped polycrystalline silicon layer 22. The doping of polycrystalline silicon layer 22 is low enough to define a resistor, but is sufficiently high to cause degeneration in the contact opening 20, providing an ohmic contact between the polycrystalline silicon layer 22 and the silicide layer 16. Thus, although the polycrystalline silicon layer 14 is N-type, no P-N junction is formed at the contact between the two layers 14, 22.

After formation of the highly doped $N^+$ regions 24, the polycrystalline silicon layer 22 is etched to define interconnect, leaving the structure shown in FIG. 3. The device is then ready for formation of further oxide and interconnect levels as desired.

Figure 4:
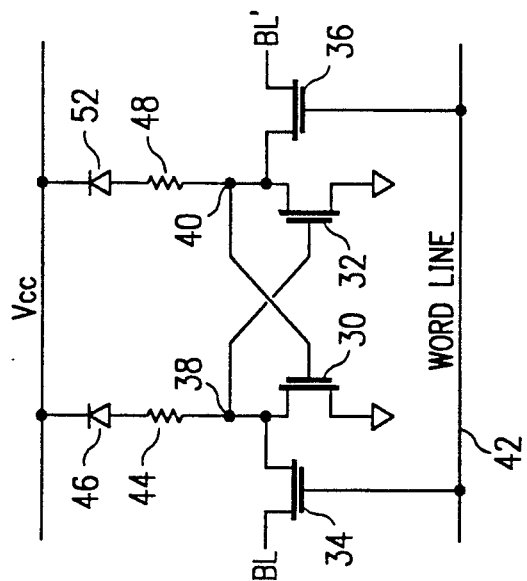
FIG. 4 is a schematic diagram of an SRAM cell utilizing an ohmic contact formed according to the present invention.

Referring to FIG. 4, a 4-transistor SRAM cell is shown. The contact structure formed in FIG. 1-3 is suitable for use as a load element in the cell of FIG. 4.

Cross-coupled field effect devices 30, 32 form the basis of the SRAM cell. Access transistors 34, 36 connect the bit line BL and complemented bit line BL' to common nodes 38, 40, respectively. Access transistors 34, 36 are driven by the word line 42 as known in the art. Node 38 is connected to the power supply line $V_{cc}$ through resistor 44 and diode 46. Node 40 is connected to $V_{cc}$ through resistor 48 and diode 50.

Node 38 corresponds to contact opening 20 in FIG. 3. Resistor 44 corresponds to polycrystalline silicon region 22 of FIG. 3, with diode 46 being formed at the junction 26. Node 40, resistor 48, and diode 50 correspond to FIG. 3 in a similar manner.

Since the contact at contact opening 20, corresponding to nodes 38 and 40, is an ohmic contact, the load for the SRAM cell is formed by a resistor and a diode rather than back-to-back polycrystalline silicon diodes. In some SRAM cell designs, this can provide improved performance over the use of a resistor alone, or back-to-back polycrystalline silicon diodes.

A similar ohmic contact can be formed between a lower polycrystalline silicon layer which is doped P-type and an upper N-type layer. The silicide layer prevents formation of a P-N junction in the contact opening.

While the invention has been particularly shown and described with reference to a preferred embodiment, it will be understood by those skilled in the art that various changes in form and detail may be made therein without departing from the spirit and scope of the invention.

What is claimed is:

1. A method for forming a contact in a semiconductor integrated circuit device, comprising the steps of:
    forming a first polycrystalline silicon interconnect layer having a first conductivity type;
    forming a silicide layer on the first polycrystalline silicon interconnect layer;
    forming an insulating layer over the entire device;
    forming a contact opening in the insulating layer, wherein a contact region on an upper surface of the silicide layer is exposed;
    forming a second polycrystalline silicon interconnect layer having a second conductivity type over the insulating layer, wherein the second polycrystalline silicon interconnect layer makes ohmic contact with the silicide layer through the contact opening.

2. The method of claim 1, wherein the first and second conductivity types are the same type, and wherein the second polycrystalline silicon interconnect layer is lightly doped relative to the first polycrystalline silicon interconnect layer.

3. The method of claim 1, wherein the first and second conductivity types are of opposite types.

4. The method of claim 1, wherein the first and second conductivity types are the same type, and wherein the first polycrystalline silicon interconnect layer is lightly doped relative to the second polycrystalline silicon interconnect layer.

5. The method of claim 3, wherein the first conductivity type is N-type, and the second conductivity type is P-type.

6. The method of claim 3, wherein the first conductivity type is P-type, and the second conductivity type is N-type.

7. A method for forming a contact in a semiconductor integrated circuit device, comprising the steps of:
    forming a first polycrystalline silicon interconnect layer having a first conductivity type;
    forming a silicide layer on the first polycrystalline silicon interconnect layer;
    forming an insulating layer over the entire device;
    forming a contact opening in the insulating layer, wherein a contact region on an upper surface of the silicide layer is exposed;
    forming a second polycrystalline silicon interconnect layer having a second conductivity type opposite to the first conductivity type over the insulating layer, wherein the second polycrystalline silicon interconnect layer makes ohmic contact with the silicide layer through the contact opening; and
    forming a region having the first conductivity type within the second polycrystalline silicon interconnect layer at a location spaced from the contact opening, wherein a P-N junction is formed within the second polycrystalline silicon interconnect layer.

* * * * *